(12) United States Patent
Gritti

(10) Patent No.: US 7,605,476 B2
(45) Date of Patent: Oct. 20, 2009

(54) STACKED DIE SEMICONDUCTOR PACKAGE

(75) Inventor: Alex Gritti, Vimercate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 255 days.

(21) Appl. No.: 11/528,841

(22) Filed: Sep. 27, 2006

(65) Prior Publication Data

US 2007/0069391 A1    Mar. 29, 2007

(30) Foreign Application Priority Data

Sep. 27, 2005    (EP)    ................... 05020989

(51) Int. Cl.
*H01L 23/02*    (2006.01)
*H01L 23/48*    (2006.01)

(52) U.S. Cl. ............... 257/777; 257/686; 257/E25.005; 257/E25.006; 257/E25.021; 257/E25.027; 257/E23.085

(58) Field of Classification Search ................ 257/685, 257/686, 723, 777, E25.005, E25.006, E25.021, 257/E25.027, E23.085
See application file for complete search history.

(56) References Cited

U.S. PATENT DOCUMENTS

| | | | | |
|---|---|---|---|---|
| 6,072,700 | A | | 6/2000 | Nam |
| 6,762,472 | B2 * | | 7/2004 | Loh et al. ................... 257/432 |
| 7,196,407 | B2 * | | 3/2007 | Takahashi ................... 257/686 |
| 2002/0171136 | A1 | | 11/2002 | Hiraoka et al. |
| 2003/0011062 | A1 | | 1/2003 | Watanabe |
| 2003/0203537 | A1 | | 10/2003 | Koopmans |
| 2004/0195591 | A1 | | 10/2004 | Gehman et al. |
| 2004/0251529 | A1 | | 12/2004 | Lee et al. |
| 2005/0133932 | A1 * | | 6/2005 | Pohl et al. ................... 257/777 |
| 2005/0146009 | A1 | | 7/2005 | Corisis et al. |
| 2005/0179127 | A1 | | 8/2005 | Takyu et al. |
| 2006/0180942 | A1 * | | 8/2006 | Kuroda et al. ................ 257/777 |
| 2006/0261492 | A1 * | | 11/2006 | Corisis et al. ................ 257/777 |

FOREIGN PATENT DOCUMENTS

| | | |
|---|---|---|
| JP | 2000307057 | 11/2000 |
| JP | 2004006990 | 1/2004 |
| WO | 03061006 A2 | 7/2003 |

* cited by examiner

*Primary Examiner*—Jasmine J Clark
(74) *Attorney, Agent, or Firm*—Lisa K. Jorgenson; Robert Iannucci; Seed IP Law Group PLLC

(57) ABSTRACT

A stacked die semiconductor package includes: a substrate, having a first surface and an opposite surface thereto; a plurality of dice, structured for being stacked one on top of the other on the first surface of the substrate, including at least a first die which is mounted closest to the first surface, a second die mounted thereupon and having a larger footprint area than the first die, and a top die having a smaller footprint area than the underlying die thereof, and each having a plurality of contact pads and a plurality of wires for electrically connecting the dice to the first surface of the substrate; at least one interposer between the plurality of dice; advantageously, said top die is electrically directly connected to one of the underlying dice. A method for the assembly of a stacked die semiconductor package is provided.

28 Claims, 9 Drawing Sheets

STACKED DIE SEMICONDUCTOR PACKAGE

TECHNICAL FIELD

The present disclosure generally relates to a stacked die semiconductor package and manufacturing methods thereof.

More in particular, but not exclusively, the present disclosure relates to a ball grid array (BGA) semiconductor, and the following description is made with reference to such a specific technical field for the sole purpose of simplifying the disclosure of the invention.

BACKGROUND INFORMATION

In the past few years, BGA semiconductor packages have enjoyed widespread use and success in the industry thanks to the many advantages they offer compared to the more traditional leadframe packages. The most obvious advantage they confer is their ability to host an increased number of interconnections within small dimensions whilst maintaining satisfactory ease of use and safety levels. This feature enables them to be used successfully in many high performance applications such as microprocessors, controllers, memories and chip sets, which require high density interconnection semiconductors.

With reference to FIG. 1, the basic architecture of a typical BGA package 1 is as follows: a solder ball base 17, providing external electrical interconnection with the rest of the system, underlies a substrate 2, usually made of an organic material, e.g., silicon, resin or glass, which in turn underlies a die 5.

The solder balls 20, which functionally replace the leads used in leadframe or Pin Grid Array (PGA) packages, are attached to a bottom 4 of the substrate 2 and their composition may include, for example, copper, tin, silver, lead, or bismuth. Typically, a 10×10 mm BGA package will contain up to 300 solder balls.

Solder balls are mechanically tougher than leads, thus enabling the device to better tolerate rough handling. Also, ball arrays allow for slightly imperfect placement during mounting as they are, to a certain extent, capable of self alignment to their attachment sites.

With reference now to FIG. 2, the substrate 2 is the key element of the package 1 and practically includes a small printed circuit board (PCB). As well as constituting the mechanical support of the silicon, the substrate 2 also has a fundamental role from the electrical point of view. Usually, a standard substrate is made of an organic core 13 covered by two copper foils 11, one on an upper surface 3 and one on a lower surface 4 of the substrate 2. By a dedicated mask etching process, these two copper foils create a connection between bond pads 14 situated on the upper surface 3, and ball pads 15 on the lower surface 4, and to which the solder balls 20 adhere. Plated through holes 12 (usually metal plated), also called vias, are drilled in the organic core 13 to provide electrical connections between the two copper foils. In order to do so, capture pads usually surround each via 12.

The upper surface 3 is surmounted by the die 5, which can be connected to the ball grid array either by wire-bonding 9 or flip-chip attachment, and which will typically require a large number of connections. Normally, the die 5 is attached to the substrate 2 (and/or to another die) with the aid of an adhesive material 16 that can be a glue or bi-adhesive tape.

With reference to FIGS. 3, 4 and 5 when more than one die 5, 6, 7, is required in a same package, it is quite common to stack them on top of one another. Stacked dice can either be of the same (or similar) size, in which case an "interposer" 10 is used between dice (as shown in FIG. 3) to allow a sufficient clearance (at least 250 μm, or example) for wire bonding, or can be of substantially different sizes, in which case they are piled up on top of each other in order of decreasing size, according to a pyramidal scheme, which takes the name of "pyramidal stack" (such as shown in FIGS. 4 and 5). This latter scheme, as opposed to the former "twin stack" scheme, does not require the use of an interposer.

The die, comprising a semiconductor device, is normally encapsulated with a protecting material (normally epoxy resin) 21 to confer protection from dust and other external agents including mechanical abuse.

Die stacking achieves the purpose of reducing the overall dimensions of the BGA package for a given number of required interconnections.

However, as the demand for further and improved miniaturization continuously increases, so does the interconnection density to be handled in a given BGA package. The challenge thus lies in being able to handle the required high (e.g., greater than 50) interconnection density with a minimum of footprint area (e.g., surface area at a base of the package).

Various approaches have been attempted in this respect, the most noteworthy being the ones briefly discussed below.

Application WO03061006, filed on Jan. 9, 2003 in the name of Micron Technology Inc, discloses semiconductor devices and stacked die assemblies and methods of manufacturing the devices and assemblies for increasing semiconductor device density. In one embodiment of the invention, it discloses a stacked die assembly comprising a first bottom die disposed on a substrate, a bonding element connecting bond pads on an active surface of the bottom die to terminal pads on the substrate, and a second die mounted on the bottom die. The second die has a bottom surface with a recessed edge along the perimeter of the die that provides an opening for the bonding element extending from the bond pads of the bottom die, thus eliminating the need for a spacer between the two dice for clearance. A second bonding element connects the bond pads on the active surface of the second die to terminal pads on the substrate.

Other BGA multi-chip packages are also known from U.S. Pat. No. 6,072,700 issued on Jun. 6, 2000 to Hyundai Electronics Industries Co., Ltd., U.S. Patent Application Publication No. US2004251529 published on Dec. 16, 2004 in the name of Lee and Lee, Japanese Patent Application No. 2004006990 published on Jan. 8, 2004 in the name of Nippon Electric Co., and U.S. Patent Application Publication No. 2003011062 published on Jan. 16, 2003 in the name of Watanabe.

However, the solutions devised in the prior art do not always achieve a full optimization of the space used, resulting in packages that are bulkier than desired. Also wire routing problems are quite common, especially when the smallest die requires a high density of interconnections, thus resulting in strong routing limitations or the need for unduly long wires, which in turn pose safety risks as they are susceptible to short circuiting. Also, long wires are detrimental to the electrical performance of the respective die especially in case of high working frequency.

BRIEF SUMMARY

One embodiment addresses a need for a semiconductor package stacking technology that will enable to stack high interconnection density dice in such a way that the footprint area is reduced and the dice are connected by an efficient and rationalized routing involving short interconnection wire lengths, thereby overcoming the shortcomings of the prior art.

The solution proposed by one embodiment of the present invention is that of providing a stacked die semiconductor package comprising a plurality of dice stacked so that a substrate underlies a high interconnection density small sized die, which in turn underlies a larger sized die, and wherein the top die, furthest from the substrate, is directly electrically connected to an underlying die.

Therefore, according to one embodiment of the present invention, there is provided a stacked die semiconductor package that comprises:

a) a substrate, having a first surface and an opposite surface thereto;

b) a plurality of dice, structured for being stacked one on top of the other on said first surface of said substrate, comprising at least a first die which is mounted closest to said first surface, a second die mounted thereupon and having a larger footprint area than said first die, and a top die having a smaller footprint area than the underlying die thereof, and each having a plurality of contact pads and a plurality of wires for electrically connecting said dice to said first surface of said substrate; and b) at least one interposer between said plurality of dice;

wherein said top die is electrically directly connected to one of said underlying dice.

According to another aspect of the present invention, there is provided a method for the assembly of a stacked die semiconductor package that comprises:

a) providing a substrate having a first surface and an opposite surface thereto;

b) providing a plurality of dies structured for being stacked one on top of the other on said first surface of said substrate, comprising at least a first die; a second die having a larger footprint area than said first die; a top die and a further die underlying said top die and having a greater footprint area than said top die;

c) mounting said first die on said first surface of said substrate;

d) connecting through wire connections said first die to said first surface of said substrate;

e) providing an interposer;

f) mounting said interposer on top of said first die;

g) mounting said second die on said interposer;

h) connecting through wire connections said second die to said first surface of said substrate;

i) mounting said top die over said further die; and j) connecting through wire connections said top die to said further die.

The characteristics and features of the method and of the stacked die semiconductor package according to one or more embodiments of the invention will be apparent from the following description of aspects thereof given by way of indicative and non limiting example(s) with reference to the annexed drawings.

DETAILED DESCRIPTION

In the following description, numerous specific details are given to provide a thorough understanding of embodiments. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
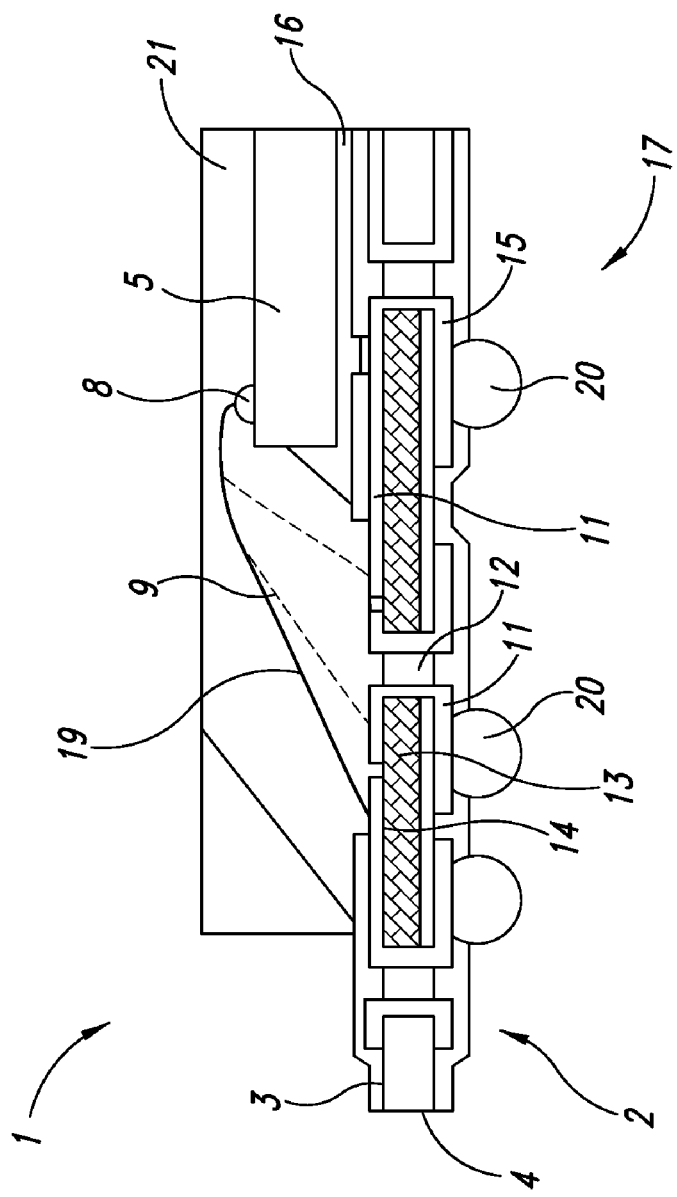
FIG. 1 shows a schematic section of a typical BGA package according to the prior art.
Figure 2:
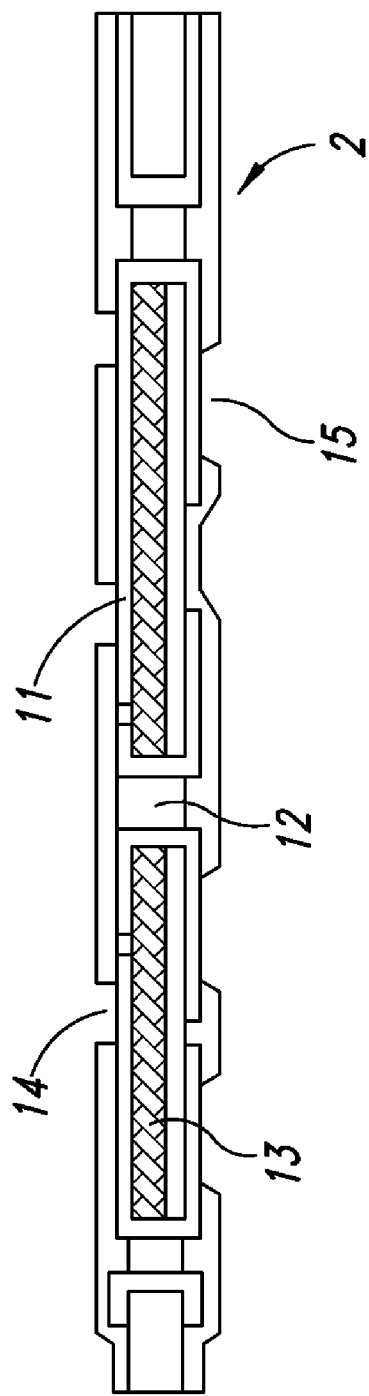
FIG. 2 shows a schematic section of a typical substrate according to the prior art.
Figure 3:
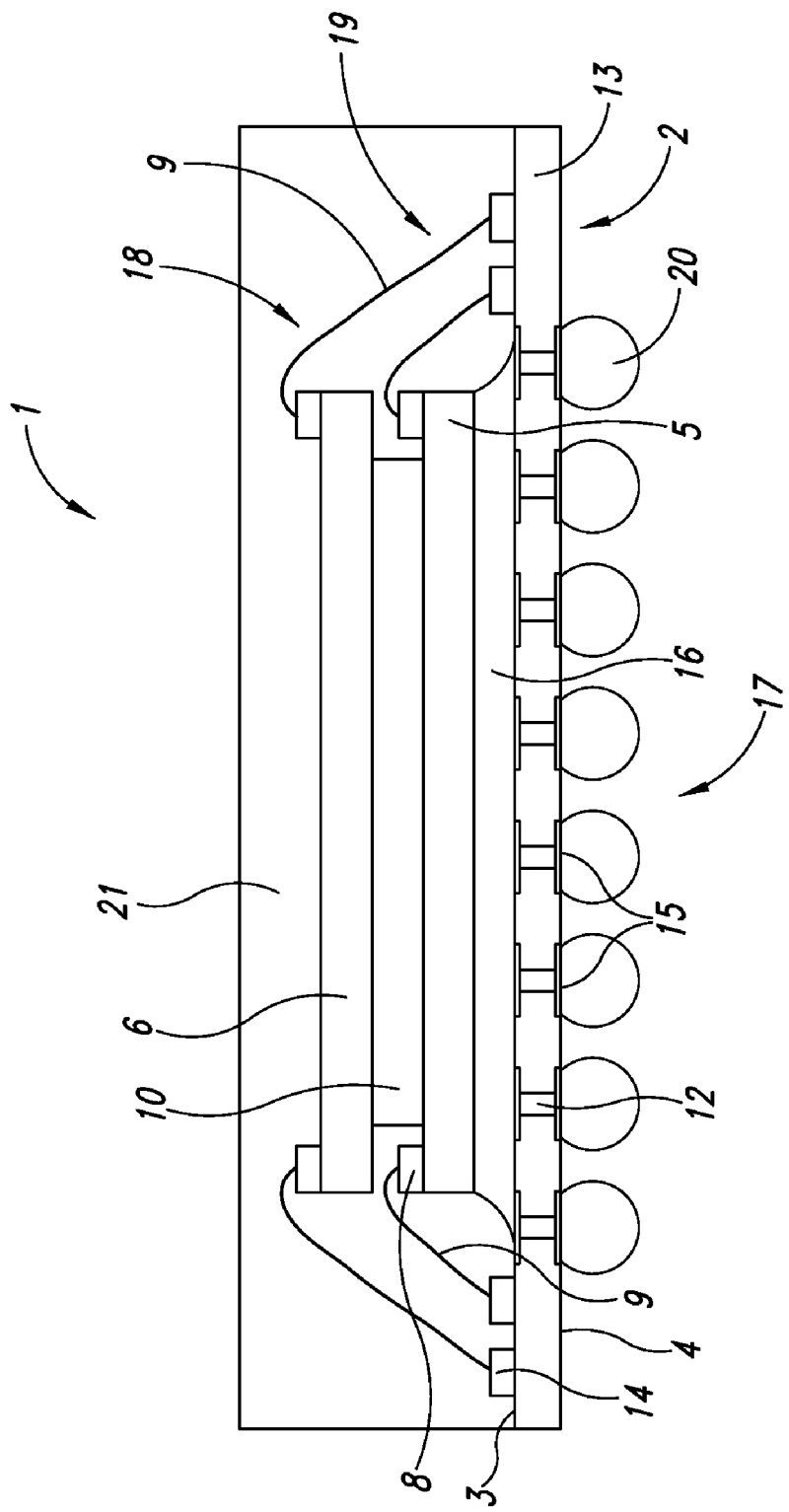
FIG. 3 schematically shows a typical stacked dice BGA package according to the prior art, wherein two dice are stacked according to the "twin stack" scheme.
Figure 4:
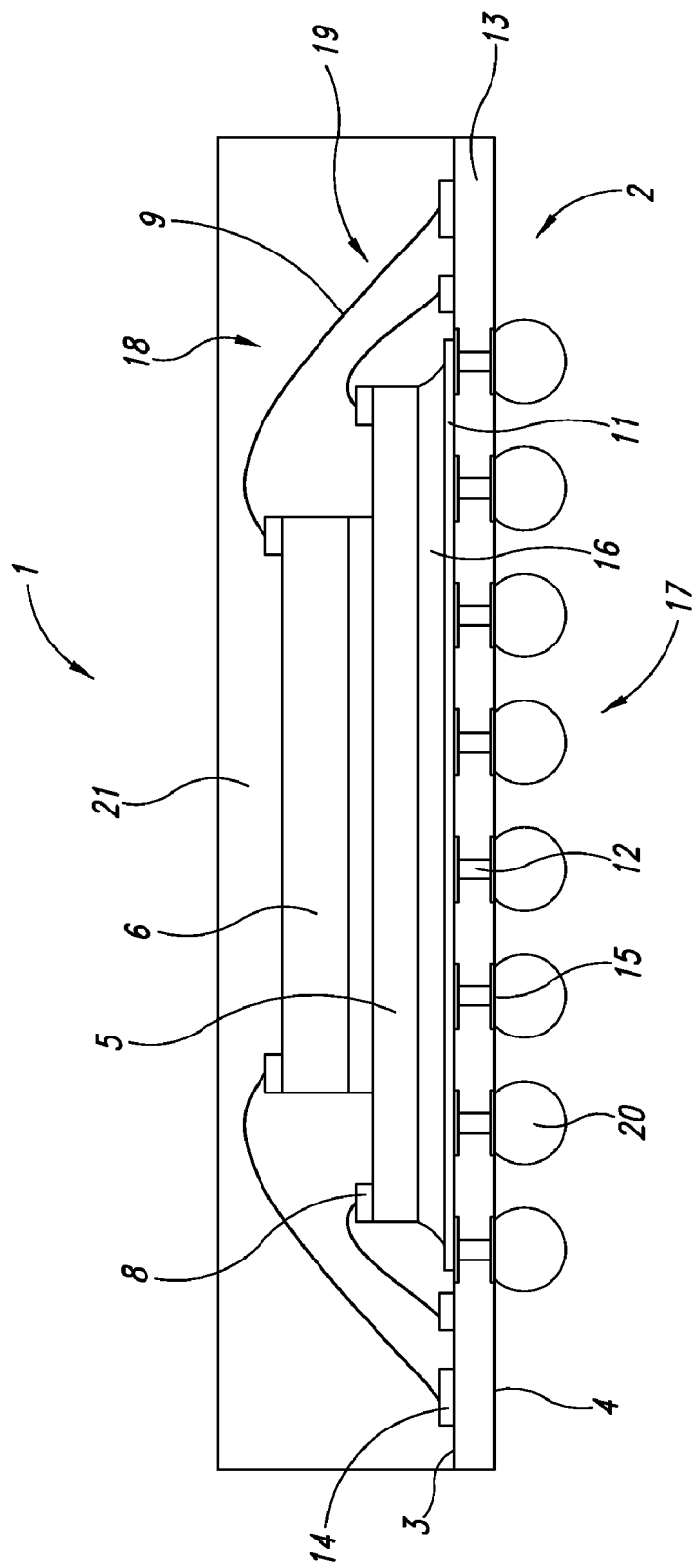
FIG. 4 schematically shows a typical stacked dice BGA package according to the prior art, wherein two dice are stacked according to the "pyramidal stack" scheme.
Figure 5:
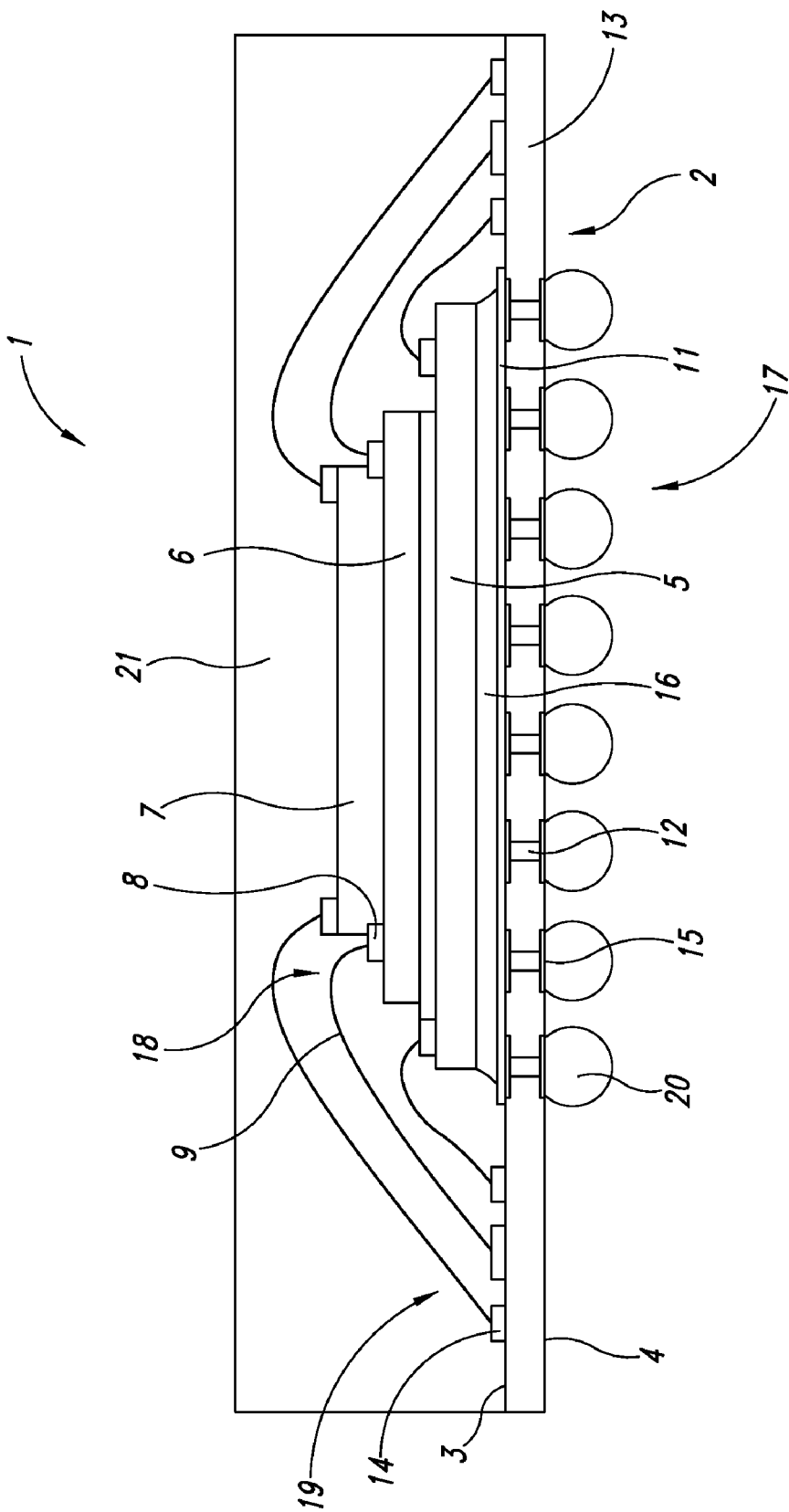
FIG. 5 schematically shows a typical stacked dice BGA package, according to the prior art, wherein three dice are stacked according to the "pyramidal stack" scheme.
Figure 6:
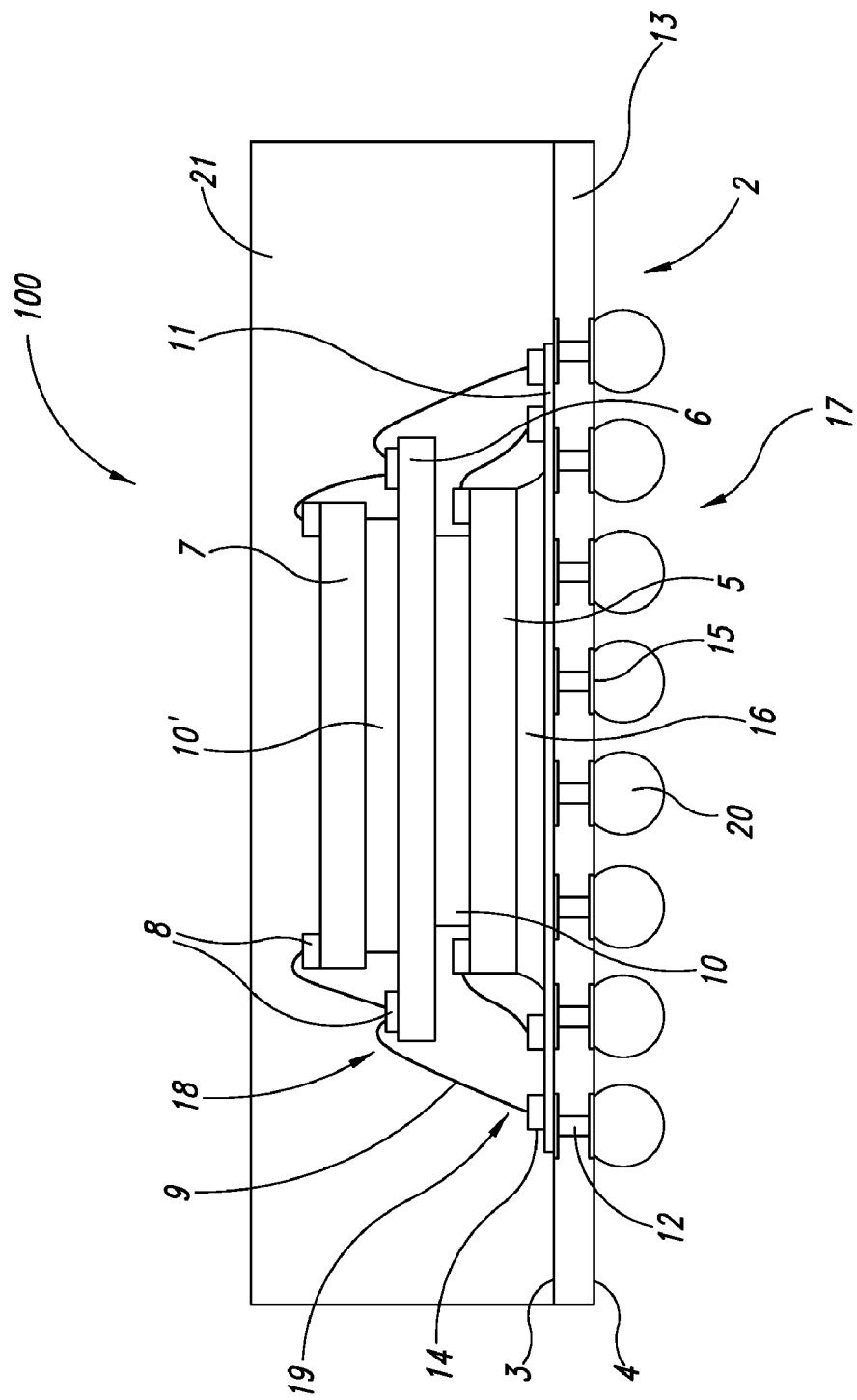
FIG. 6 schematically shows a stacked dice BGA package according to a first aspect or embodiment of the invention, wherein the total number of dice is three and the top die is separated from the underlying die by an interposer.

With reference to such figures, and in particular to FIG. 6, one embodiment of a stacked die semiconductor package, indicated in its entirety by reference number 100, is disclosed.

The same reference numbers have been used to indicate structurally and functionally equivalent elements with respect to the prior art description.

The stacked die semiconductor package 100 comprises a substrate 2, a solder ball array 17, dice 5, 6 and 7, and interposers 10, 10'. The substrate 2 can be made of bismaleimide and triazine (BT) resin, glass, ceramic or FR-4 (Flame Retardant), more preferably BT resin, or other suitable material. The substrate 2 exhibits a first, or upper, surface 3, an opposite, or lower, surface 4 thereof and an organic core 13, through which through holes, or vias, 12 are drilled. Surfaces 3 and 4 may be covered by a layer of copper 11 for connecting to each other via the vias 12, which may be metal plated.

On the upper surface 3 of the substrate 2 are placed a plurality of bond pads 14 usually made of copper and including a suitable finishing for wire bonding (for example Ni/Au).

A first die 5, characterized by having an interconnection density greater than 50, is placed on the upper surface 3 of the substrate 2. The first die 5, which can be made of Si or GaAs or other suitable material, preferably Si in one example embodiment, may be attached to the upper surface 3 of the substrate 2 by means of a die attach adhesive 16 which can be glue or tape.

On top of the first die 5 is an interposer 10 made of silicon, tape or metal, preferably silicon in one example embodiment, and which may be attached to the die 5 by means of a die attach adhesive 16 as previously.

On top of the interposer 10 is placed a second die 6, which can be made of Si or GaAs or other suitable material, preferably Si in one example embodiment. Again, the second die 6 may be attached to the interposer 10 by means of a die attach adhesive or tape, as previously.

Advantageously, according to one embodiment of the present invention, the second die 6 is characterized by having a larger footprint area than the first die, e.g., its overall length and width dimensions are greater than those of the first die.

Both first and second dice 5 and 6 exhibit contact pads 8 on a surface thereof for wire connection to the bond pads 14 on the upper surface 3 of the substrate 2, or to another die.

Wires 9 are made of Au, Al or Cu or other suitable material, preferably Au in one example embodiment, and are attached at one end 18 to one of a plurality of contact pads 8 on a surface of the die 5 or 6, and at the other end 19 to one of a plurality of bond pads 14 found on the upper surface 3 of the substrate 2.

The second die 6 may be in turn surmounted by a second interposer 10' separating the second die 6 from a third and top die 7 located on top of the second die 6, as shown in FIG. 6.

The third and top die 7 exhibits contact pads 8 on a surface thereof for connecting them to the contact pads 8 of the underlying second die 6, for example by means of bonding wires using the Ball Stitch On Ball (BSOB) technique.

Advantageously, according to one embodiment of the present invention the third and top die 7 is characterized by having a smaller footprint area than the second die 6, e.g., its overall wires length and width dimensions are smaller than those of the second die 6.

Wires 9 are made of Au, Al or Cu or other suitable material, preferably Au in one example embodiment, and are attached at one end 18 to one of a plurality of contact pads 8 of the third and top die 7, and at the other end 19 to contact pads 8 found on the upper surface of the underlying second die 6.

The contact pads 8 can be made of Al, Si, Cu, Au, Ni, or other suitable material and/or combinations thereof, preferably AlSi in one example embodiment.

Normally bond pads 14 are arranged so that all four sides of the dice 5, 6, 7 are wire connected; however, fewer than four sides of the dice 5, 6, 7 may be involved in wire connection, typically two in one example embodiments.

On the lower surface 4 of the substrate 2 are placed a plurality of ball pads 15 made of copper and including a suitable finishing for the respective attachment of a plurality of solder balls 20 (for example Ni/Au or Organic Surface Protection).

The solder balls 20 are usually arranged in a uniform pattern on the lower surface 4 of the substrate 2 according to a uniform pattern to form the ball grid array 17 and are typically present in a number comprised between 10 and 1000, more preferably between 25 and 400 in one example embodiment.

The solder balls 20, which may include materials such as tin lead or any lead free metal alloy or other suitable material, preferably SnAgCu in one example embodiment, are attached to the lower surface 4 of the substrate 2 by means of a plurality of ball pads 15.

The substrate 2 and the dice 5, 6 and 7 are usually encapsulated by a protecting material 21 which can be made of epoxy resin, liquid resin or metal cup or other suitable material, more preferably molded epoxy resin in one example embodiment.

Figure 7:
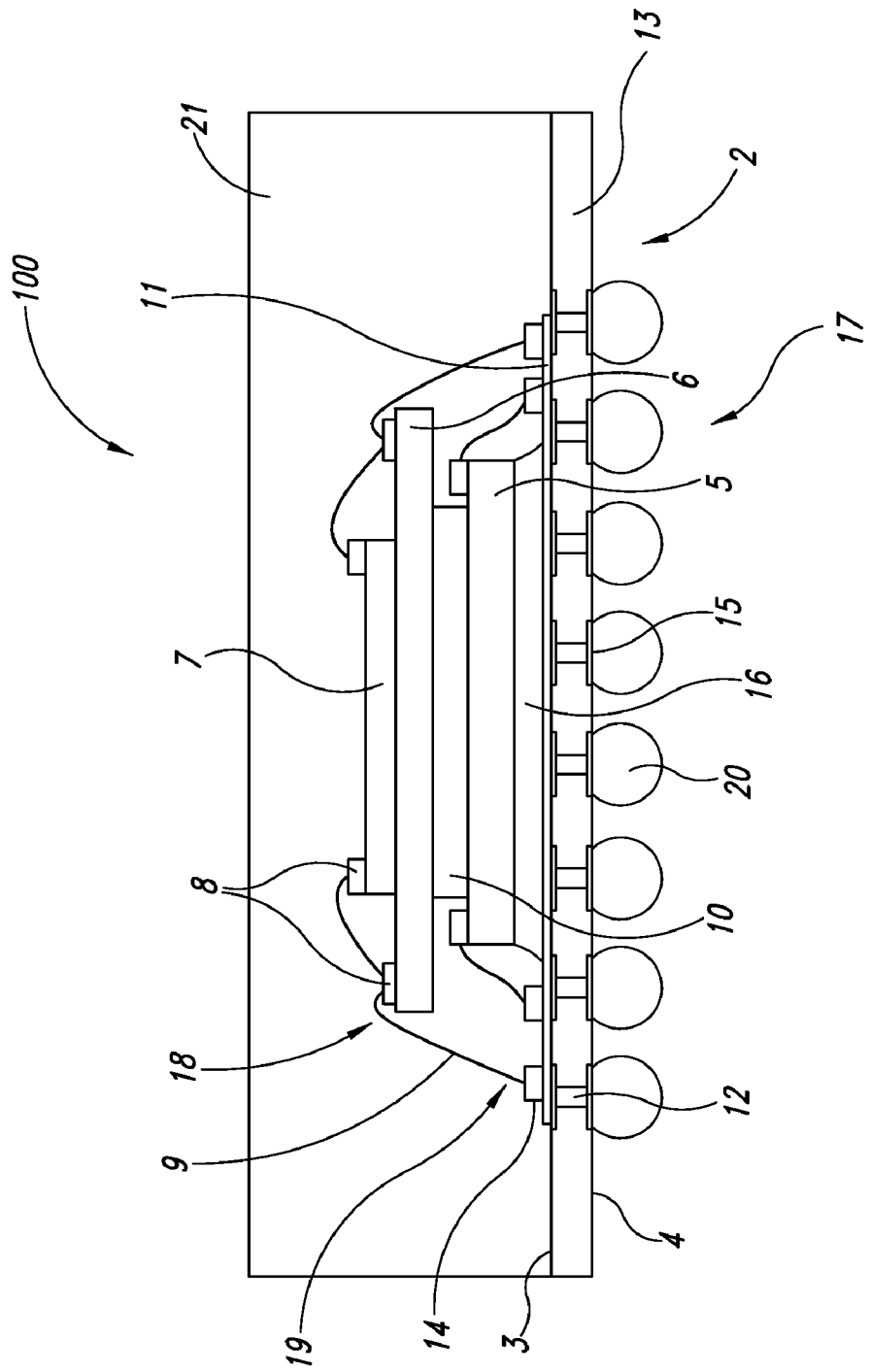
FIG. 7 shows a schematic of a stacked dice BGA package according to a second aspect or embodiment of the invention, wherein the total number of dice is three and the top die is stacked directly on top of the underlying die.

According to one embodiment of the invention, no interposer 10' is required between the second die 6 and the third and top die 7. In this embodiment, shown in FIG. 7, the third die 7 is of substantially smaller dimensions than the second die 6.

According to another embodiment of the invention, the third die 7 may be further surmounted by one or more dice 7' optionally with the aid of further interposers 10".

Figure 8:
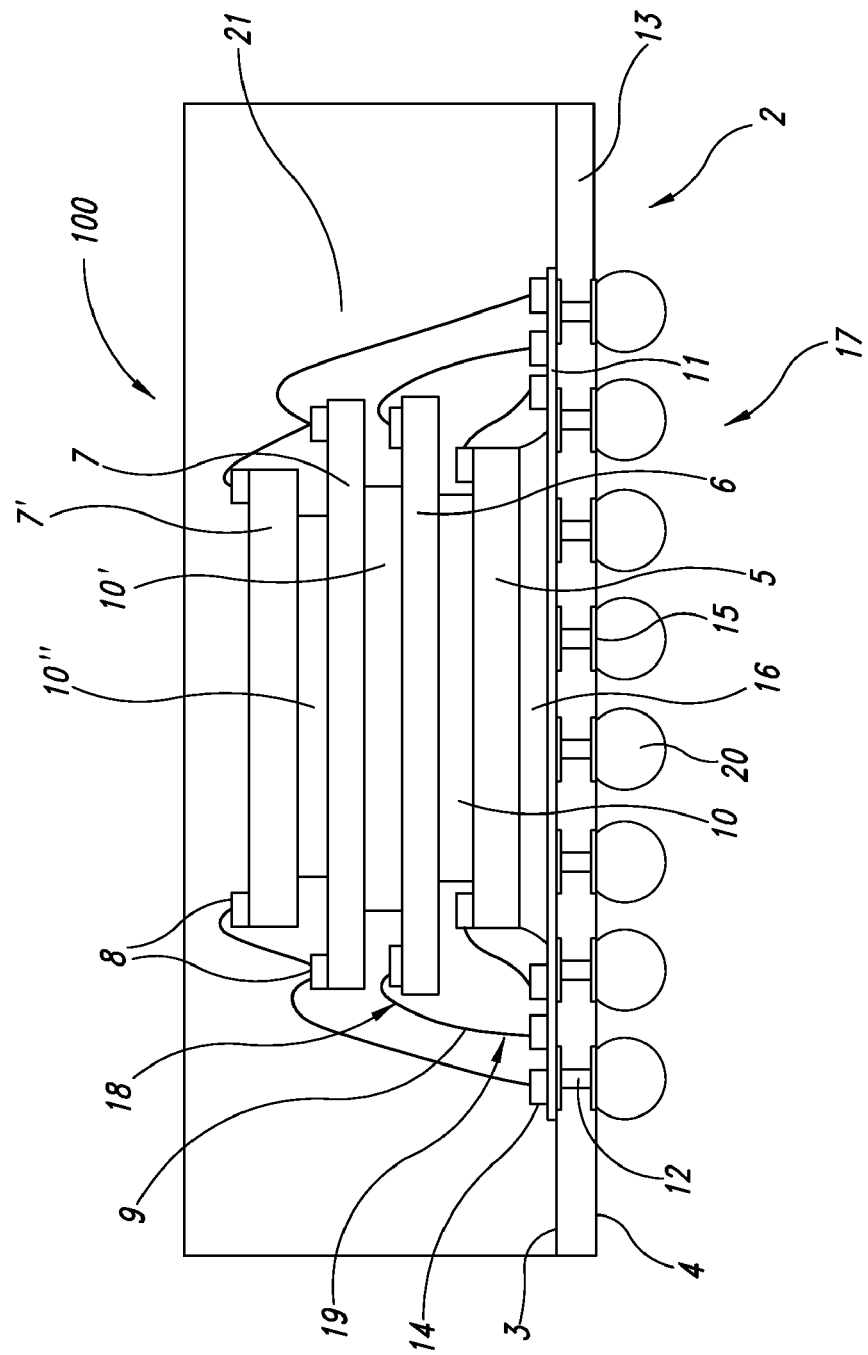
FIG. 8 schematically shows a stacked dice BGA package according to a third aspect or embodiment of the invention, wherein the total number of dice is four and the top die is separated from the underlying die by an interposer.

FIG. 8 represents a BGA package comprising four dice wherein the third die 7 is surmounted by a fourth and top die 7' the two dice 7, 7' being separated by an interposer 10". The second die 6 and the third die 7 are here represented as having similar dimensions and/or footprint area. According to this embodiment, the third die 7 may be of smaller, larger or same dimensions and/or footprint area as the second die 6.

The fourth and top die 7' is smaller than the third die 7 and may be connected to the latter by wire bonding connecting contact pads 8 present on both dice using the Ball Stitch On Ball (BSOB) technique. First, second and third dice, 5, 6 and 7, are wire connected to the substrate, as previously described in the first embodiment.

Figure 9:
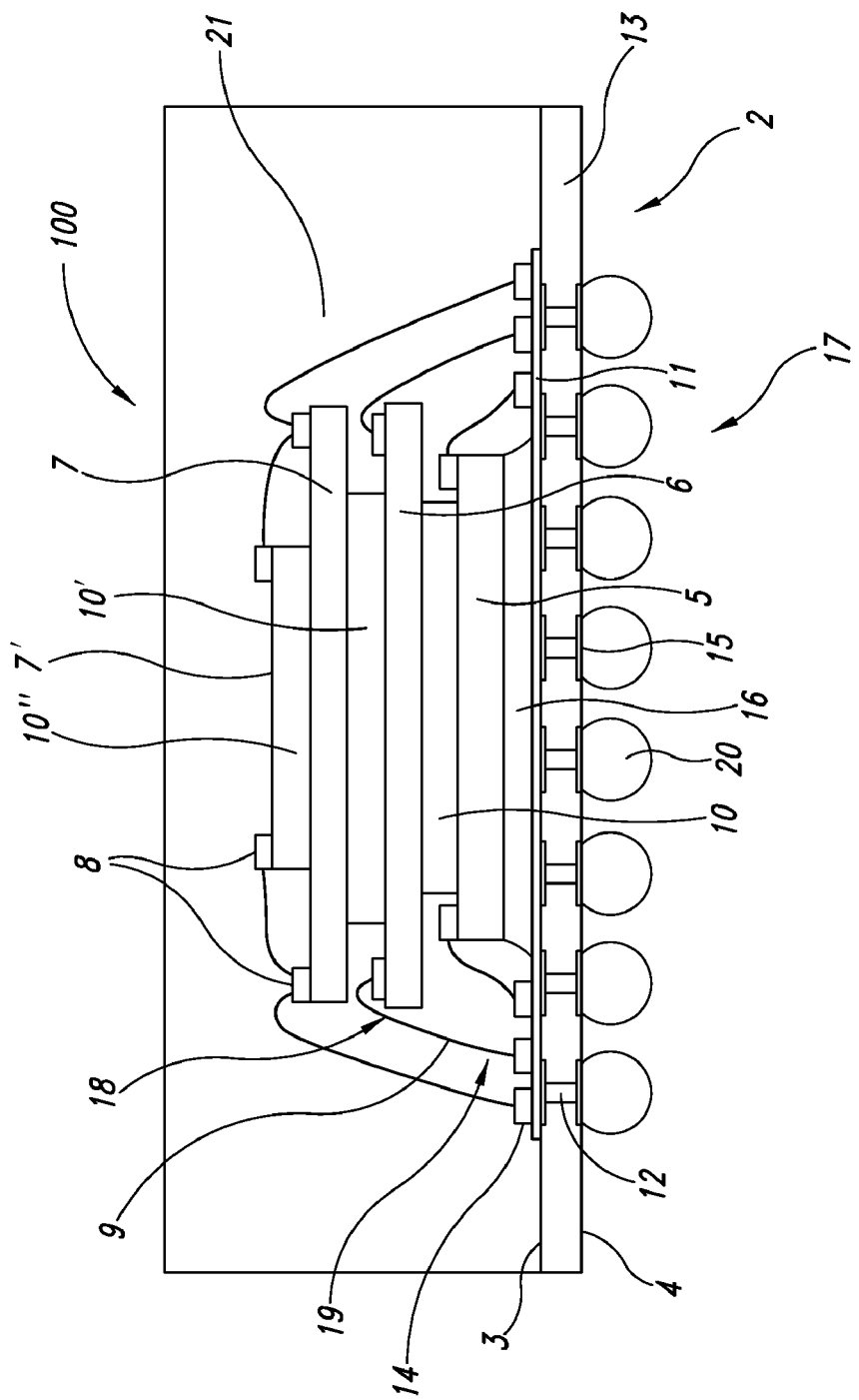
FIG. 9 shows a schematic of a stacked dice BGA package according to a fourth aspect or embodiment of the invention, wherein the total number of dice is four and the top die is stacked directly on top of the underlying die.

In the embodiment represented by FIG. 9, the third die 7 is surmounted by a fourth and top die 7', the two dice 7, 7' not being separated by an interposer. The second die 6 and the third die 7 are here represented as having similar dimensions and/or footprint area. According to this embodiment, the third die 7 can be of smaller, larger or same dimensions and/or footprint area as the second die 6.

The fourth and top die 7', having dimensions and/or footprint area substantially smaller than those of the third die 7, may be connected to the third die 7 by wire bonding connecting contact pads 8 present on both dice using the Ball Stitch On Ball (BSOB) technique. First, second and third dice, 5, 6 and 7, are wire connected to the substrate, as previously described in the first embodiment.

In the following lines, a more detailed description of one or more embodiments of methods for manufacturing the stacked die semiconductor package according to the present invention is given. In particular, reference will be made to examples of packages substantially corresponding to the first and third embodiments of FIGS. 6 and 8.

EXAMPLE 1

Three-Die Stacked BGA Package

A BT resin substrate was covered with a layer of copper on its upper and lower surfaces and copper plated through holes were drilled through its core. A silicon die measuring 3.5×2.5×0.13 mm was attached to the upper surface of the substrate by means of glue. The wire bonding between the upper surfaces of the die and of the substrate were then done by connecting the AlSi contact pads on the upper surface of the die to the copper bond pads on the upper surface of the substrate by means of gold wires. The bond pads included a suitable finishing for wire bonding made of Ni/Au. Then, a 1.6 mm thick silicon interposer having tape on its upper and lower surfaces, was placed on top of the silicon die.

Then, the second die, having a greater footprint area than the first die (3.9×4.25×0.13 mm), and tape on its upper surface was placed on top of the interposer. Wire bonding was done for the second die, as described above for the first die. A second silicon interposer, having tape on both its upper and lower surfaces, was placed on top of the second die. A third silicon die, having smaller dimensions than those of the second die, was placed on top of the second interposer. Wire bonding of the third die to the second die was carried out by the BSOB technique by means of Ni/Au wire connections between bond pads on the respective dice.

Tin lead solder balls were then attached to the lower surface of the BT resin substrate by means of copper ball pads. The substrate and the dice were then encapsulated by a molded epoxy resin protecting material.

EXAMPLE 2

Four-Die Stacked BGA Package

A BT resin substrate was covered with a layer of copper on its upper and lower surfaces and copper plated through holes were drilled through its core. A silicon die measuring 3.5× 2.5×0.13 mm was attached to the upper surface of the substrate by means of glue. The wire bonding between the upper surfaces of the die and of the substrate were then done by connecting the AlSi contact pads on the upper surface of the die to the copper bond pads on the upper surface of the substrate by means of gold wires. The bond pads included a suitable finishing for wire bonding made of Ni/Au. Then, a 1.6 mm thick silicon interposer having tape on its upper and lower surfaces, was placed on top of the silicon die.

Then, the second die, having a greater footprint area than the first die (3.9×4.25×0.13 mm), and tape on its upper surface was placed on top of the interposer. Wire bonding was done for the second die, as described above for the first die. A second silicon interposer, having tape on both its upper and lower surfaces, was placed on top of the second die.

A third silicon die, having similar dimensions than those of the second die and tape on its upper surface was placed on top of the second interposer. Wire bonding of the third die was carried as previously. A third silicon interposer, having tape on both its upper and lower surfaces, was then placed on top of the third die.

A fourth silicon die, having a similar footprint area to the first die (3.5×2.5×0.13 mm) and tape on its lower surface was placed on top of the third interposer. Wire bonding of the fourth die to the underlying third die was carried out by the BSOB technique by means of Ni/Au wire connections between bond pads on the respective dice.

Tin lead solder balls were then attached to the lower surface of the BT resin substrate by means of copper ball pads. The substrate and the dice were then encapsulated by a molded epoxy resin protecting material.

One embodiment of the present invention also relates to a method for the assembly of a stacked die semiconductor package. The method comprises:

a) providing a substrate 2 having a first surface 3 and an opposite surface 4 thereto;

b) providing a first die 5;

c) mounting the first die 5 on the first surface 3 of the substrate 2;

d) connecting through wire connection 9 means the first die 5 to the first surface 3 of the substrate 2;

e) providing an interposer 10;

f) mounting the interposer 10 on top of the first die 5;

g) providing a second die 6 having a greater footprint area than the first die 5;

h) mounting the second die 6 over the interposer 10;

i) connecting through wire connection 9 means the second die 6 to the first surface 3 of the substrate 2;

i1) optionally providing at least one additional interposer 10', 10";

i2) optionally mounting the at least one additional interposer 10', 10" on the underlying die 6,7;

j) providing one or more additional dice 7,7', the top one of which 7,7' having a smaller footprint area than the underlying die 6,7;

k) mounting the one or more additional dice 7,7' on the underlying die 6,7 or on the at least one interposer 10', 10"; and l) connecting through wire connection 9 means the top die 7, 7' to the underlying die 6, 7, and, wherever applicable, the remaining of the one or more additional dice 7, 7' to the first substrate 3 of the substrate 2.

In an embodiment of the present invention, the first die 5 has an interconnection density greater than 50.

In summary, one or more embodiments of the present invention provides a new approach to reducing the package footprint area of a stacked die semiconductor package without the disadvantages of the prior art.

It is to be understood that any number of dice of suitable varying dimensions can be stacked on the first die, according to requirements and space limitations, with or without interposer, depending on the respective sizes of the dice.

The stacked die BGA package according to one embodiment of the present invention, by virtue of its die-to-die wire connection between the top die and the underlying die, exhibits a smaller overall footprint area compared to prior art packages for a given number of interconnections. The wire bonding area is more rational and the wire lengths are shorter (as shown in FIGS. 6 to 9), thus reducing safety concerns and the risk of wire sweeping, and increasing the electrical performance of the device.

The die-to-die connection, by removing the need for a connection of the interested die to the substrate, leads to a greater efficiency of the wire connections, resulting in final packages of smaller dimensions and footprint area. There is, in fact, no need to place bond-fingers along the edge of the package substrate to enable the connection of the top die to the substrate, thus leading to a shrinking in the footprint area size. It follows that the clearing of the substrate is also made easier, as the number of connections is reduced.

The die stacking scheme according to one embodiment of the present invention may be successfully applied to systems other than BGA packages, such as, for example, leadframe packages. Moreover, it should be noted that the stacking scheme of one or more embodiments of the present invention is suitable for application in flip-chip packages.

Moreover it should be noted that the stacking scheme of one embodiment of the present invention provides more substrate area for passive attachments in a System In Package structures.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The above description of illustrated embodiments, including what is described in the Abstract, is not intended to be exhaustive or to limit the invention to the precise forms disclosed. While specific embodiments and examples are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

What is claimed is:

1. A stacked die semiconductor package, comprising:
    a substrate having a first surface and a second surface, the second surface being opposite to the first surface;
    a plurality of dice stacked one on top of another on said first surface of said substrate, the plurality of dice including a first die which is mounted closest to said first surface, a second die mounted on the first die and having a larger footprint area than said first die, and a top die having a smaller footprint area than at least the second die, and each die having a plurality of contact pads and a plurality of wires to electrically connect said dice to said first surface of said substrate; and
    at least one interposer between at least some of said plurality of dice;
    wherein said top die is electrically directly connected to one of said first and second dice.

2. The stacked die semiconductor package of claim 1 wherein said top die is electrically directly connected only to a directly underlying one of said underlying die.

3. The stacked die semiconductor package of claim 2 wherein said substrate includes at least one bond pad on said first surface and at least one ball pad on said second surface.

4. The stacked die semiconductor package of claim 2 wherein said first die has an interconnection density greater than 50.

5. The stacked die semiconductor package of claim 2 wherein said dice are attached to said first surface of said substrate, to each other and to said at least one interposer by adhesive layers.

6. The stacked die semiconductor package of claim 2 wherein said semiconductor package includes three dice, wherein said first die is placed on said first surface of said substrate and is separated from said second and top dice by said at least one interposer.

7. The stacked die semiconductor package of claim 6 wherein said top die is stacked on top of said second die and has a smaller footprint area than said second die.

8. The stacked die semiconductor package of claim 6 wherein said top die is stacked on the top of said second die and is separated from said second die by at least a further interposer.

9. The stacked die semiconductor package of claim 6 wherein said top die is stacked on the top of said second die and is connected to said second die by wire connections connecting bond pads of the top and second dice.

10. The stacked die semiconductor package of claim 2 wherein said semiconductor package includes four or more dice, wherein said first die is placed on said first surface of said substrate and is separated from other dice stacked thereover by said at least one interposer.

11. The stacked die semiconductor package of claim 10 wherein said top die is a die furthest from said first surface of said substrate and has a smaller footprint area than said underlying die.

12. The stacked die semiconductor package of claim 10 wherein said top die is a die furthest from said first surface of said substrate and is separated from said underlying die by at least a further interposer.

13. The stacked die semiconductor package of claim 10 wherein said top die is stacked on top of said underlying die and is connected to said underlying die by wire connections connecting bond pads of the top and underlying dice.

14. The stacked die semiconductor package of claim 2 wherein at least one of said dice have bond pads placed such that wire bonding occurs on fewer than four sides.

15. The stacked die semiconductor package of claim 14 wherein at least one of said dice have bond pads placed such that wire bonding occurs on two sides.

16. The stacked die semiconductor package of claim 2 wherein a plurality of solder balls are arranged in a uniform pattern on said opposite surface of said substrate.

17. The stacked die semiconductor package of claim 16 wherein said solder balls are attached to said opposite surface of said substrate by respective ball pads.

18. The stacked die semiconductor package or method of claim 2 wherein said substrate and said dice are encapsulated by a protecting material.

19. A stacked die semiconductor package, comprising:
    a substrate having a first surface and a second surface, the second surface being opposite to the first surface;
    a plurality of dice stacked one on top of another on said first surface of said substrate, the plurality of dice including a first die mounted on said first surface of said substrate; a second die having a larger footprint area than said first die; a top die; and a third die underlying said top die and having a greater footprint area than said top die; said first, second, and top dice being connected through wire connections to said first surface of said substrate; and
    a first interposer mounted on top of said first die and under said second die.

20. The package according to claim 19, further comprising a second interposer positioned between said second die and said top die.

21. A stacked die semiconductor package, comprising:
    a substrate having a first surface and a second surface, the second surface being opposite to the first surface;
    a first die mounted on said first surface of said substrate, the first die being connected through wire connections to said first surface of said substrate;
    a first interposer mounted on top of said first die;
    a second die having a greater footprint area than said first die, said second die being mounted over said first interposer and being connected through wire connections to said first surface of said substrate;
    a third die having a smaller footprint area than the second die, being mounted over said second die, being connected through wire connections to said first surface of said substrate; and
    a top die having a smaller footprint area than said third die, being mounted over said third die, and being connected through wire connections to said third die.

22. The package of claim 21, further comprising one or more additional dice mounted over said second die and connected through wire connections to said first surface of said substrate.

23. The package of claim 22, further comprising one or more further interposers mounted over said one or more additional dice.

24. A stacked die semiconductor package, comprising:
    a substrate having a first surface and a second surface;
    a plurality of dice stacked one on top of another on said first surface of said substrate, the plurality of dice including a bottom die that is mounted closest to said first surface, a first intermediate die mounted over said first die and having a larger footprint than said first die, and a top die having a smaller footprint than said first intermediate die, each die having a plurality of contact pads, at least some of said plurality of said dice being electrically coupled to said first surface of said substrate using at least some of said contact pads; and at least one interposer between at least some of said plurality of dice, wherein said top die is electrically directly coupled to said first intermediate die.

25. The package of claim 24 wherein said first intermediate die is immediately underlying the top die.

26. The package of claim 24, further comprising a ball pad positioned on said second surface, said second surface being opposite to said first surface.

27. The package of claim 24 wherein the top die is positioned directly on the first intermediate die without any interposer therebetween.

28. The package of claim 24, further comprising a second intermediate die between said top die and said bottom die, said intermediate dies having substantially equal footprints, wherein said at least one interposer includes a plurality of interposers between the intermediate dies and said bottom die.

\* \* \* \* \*